United States Patent [19]

Kornrumpf et al.

[11] Patent Number: 5,157,255
[45] Date of Patent: Oct. 20, 1992

[54] COMPACT, THERMALLY EFFICIENT FOCAL PLANE ARRAY AND TESTING AND REPAIR THEREOF

[75] Inventors: William P. Kornrumpf, Albany; Walter M. Marcinkiewicz, Schenectady; William E. Davern, Syracuse; Herbert C. Ziegler, Baldwinsville; Jonathan R. Miles, Liverpool, all of N.Y.

[73] Assignee: General Electric Company, Schenectady, N.Y.

[21] Appl. No.: 795,609

[22] Filed: Nov. 21, 1991

Related U.S. Application Data

[62] Division of Ser. No. 504,751, Apr. 5, 1990.

[51] Int. Cl.⁵ .......................... H01L 23/48
[52] U.S. Cl. .................. 250/252.1; 250/332
[58] Field of Search .............. 250/332, 252.1 A

[56] References Cited

U.S. PATENT DOCUMENTS

| | | | |
|---|---|---|---|
| 4,206,470 | 6/1980 | White | 357/30 |
| 4,709,141 | 11/1987 | Olsen | 250/332 |
| 4,714,516 | 12/1987 | Eichelberger et al. | 156/628 |
| 4,721,995 | 1/1988 | Tamizawa | 357/80 |
| 4,780,177 | 10/1988 | Wojnarowski et al. | 156/643 |
| 4,783,695 | 11/1988 | Eichelberger et al. | 357/65 |
| 4,805,420 | 2/1989 | Porter et al. | 357/83 |
| 4,835,704 | 5/1989 | Eichelberger et al. | 364/490 |
| 4,878,991 | 11/1989 | Eichelberger et al. | 156/630 |
| 4,882,200 | 11/1989 | Liu et al. | 427/53.1 |
| 4,884,122 | 11/1989 | Eichelberger et al. | 357/71 |
| 4,894,115 | 1/1990 | Eichelberger et al. | 156/643 |
| 4,897,153 | 1/1990 | Cole et al. | 156/643 |
| 4,933,042 | 6/1990 | Eichelberger et al. | 156/239 |
| 4,960,613 | 10/1990 | Cole et al. | 427/53.1 |

FOREIGN PATENT DOCUMENTS 61-214563  9/1986  Japan.
1-191481   8/1989  Japan.

*Primary Examiner*—Carolyn E. Fields
*Attorney, Agent, or Firm*—Marvin Snyder

[57] ABSTRACT

In a focal plane array sensor hybrid, a focal plane array fabricated in a chip of one semiconductor material and a read out circuit fabricated in one or more chips of a different semiconductor material are connected by a high density interconnect structure in which a layer of dielectric material is bonded to the chips and has interconnecting conductors disposed thereon and extending through via holes therein into ohmic contact with appropriate contact pads of the chips. Inclusion of a flexible portion in the high density interconnect structure enables the readout and the focal plane array chips to be disposed in different planes to provide a compact structure. Focal plane array sensor hybrid testing and repair are both facilitated by this structure.

20 Claims, 10 Drawing Sheets

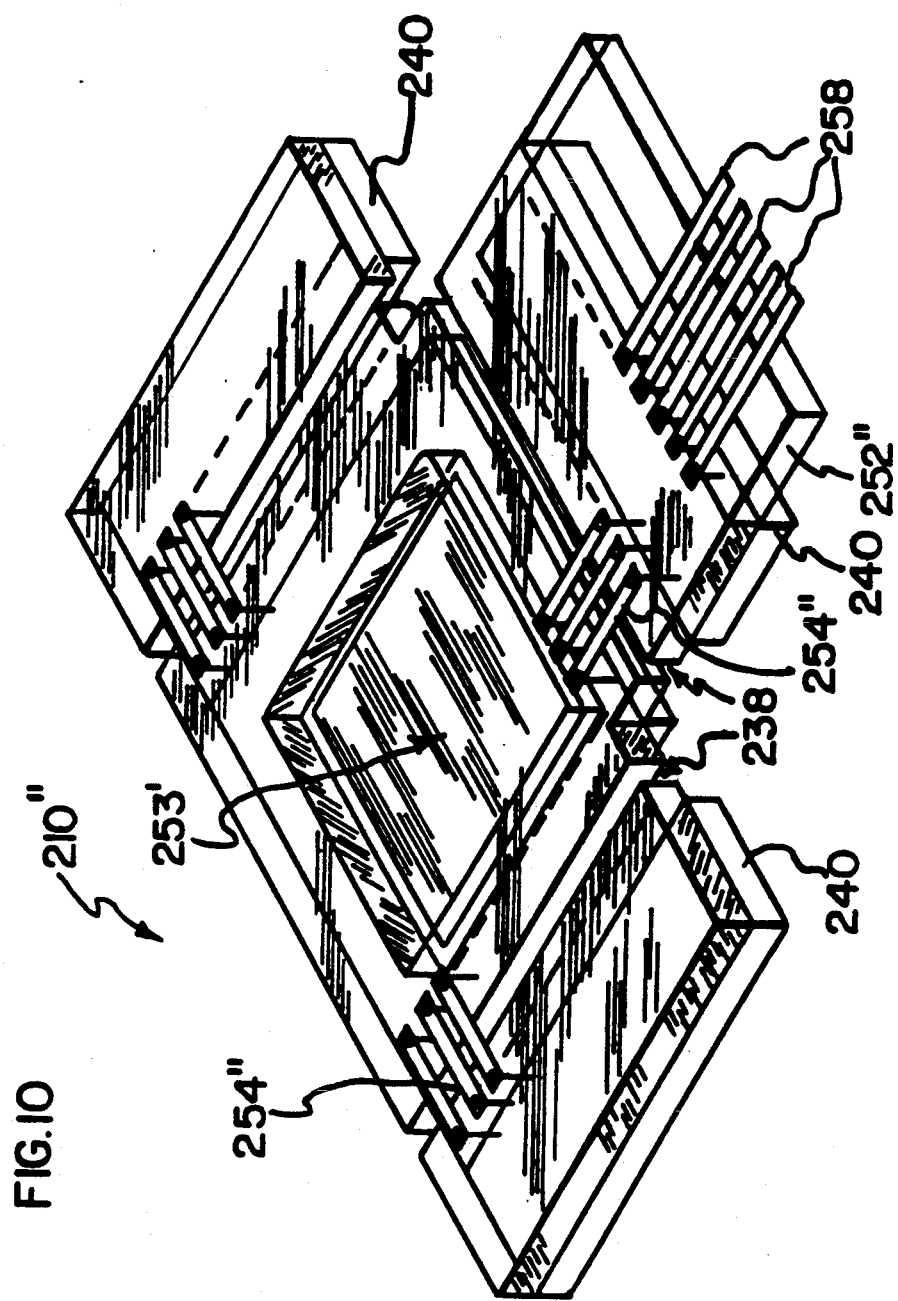

COMPACT, THERMALLY EFFICIENT FOCAL PLANE ARRAY AND TESTING AND REPAIR THEREOF

This application is a division of application Ser. No. 07/504,751 filed Apr. 5, 1990, pending.

RELATED APPLICATIONS

The present application is related to U.S. patent application Ser. No. 07/504,821 ) entitled "High Density Interconnected Microwave Circuit Assembly", by W. P. Kornrumpf et al. and U.S. patent application Ser. No. 07/504,769 entitled "A Flexible High Density Interconnect Structure and Flexibly Interconnected System" by C. W. Eichelberger et al., both of which were filed Apr. 5, 1990 concurrently with parent application Ser. No. 07/504,751 and are incorporated herein by reference in their entirety.

BACKGROUND OF THE INVENTION

1. Field of the Invention

The present invention relates to the field of focal plane arrays, and more particularly, to the field of cryogenic focal plane arrays.

2. BACKGROUND INFORMATION

Many optical surveillance systems employ focal plane arrays to sense image information. One important class of focal plane arrays are infrared sensing arrays. Such arrays are useful for image detection and motion sensing.

All objects, including the components of a focal plane array system, give off infrared radiation whose intensity is proportional to their temperature. In order to maximize system sensitivity and minimize noise, thereby maximizing signal-to-noise ratio, it is common to cool infrared sensing focal plane arrays to cryogenic temperatures in order to minimize system-induced noise in detected images and to prevent system component emissions from swamping desired low intensity images. By cryogenic temperatures, we mean temperatures of less than about 210° K. ($-63°$ C.), with the preferred operating temperatures for such systems typically being less than about 100° K.

Different semiconductor materials are inherently sensitive to different portions of the electromagnetic spectrum as a result of their internal energy band structure. Indium antimonide (InSb) and mercury cadmium telluride (HgCdTe) are well known materials which are suitable for the detection of infrared radiation. InSb is fairly extensively used in infrared sensors because of the wavelengths to which it is sensitive and because of the ability to process it with reasonable yields. One of the characteristics of InSb is that its structure is subject to temperature-induced degradation. It is considered desirable to prevent the exposure of an InSb infrared photodetector to temperatures in excess of about 150° C., since the closer to 200° C. and the longer the time for which the photodetector is exposed to such a temperature, the greater is the deterioration of an infrared photosensor in the form of increased noise and reduced detectivity. Where high sensitivity is desired, such noise is a particular problem and, therefore, high temperature exposure is studiously avoided or prevented. Mercury cadmium telluride is suitable for detection of infrared radiation over a wider band of frequencies or wavelengths than is InSb, but HgCdTe is more difficult to process and substantially more temperature sensitive than InSb. Consequently, it is not as widely used as InSb.

While InSb and HgCdTe are suitable for infrared detection, they are not suitable for the formation of integrated circuits or other electronics suitable for processing of image information which is collected by suitably processed imagers. Consequently, it is the standard practice in the infrared sensing art to connect an infrared sensor such as InSb or HgCdTe to silicon-based integrated circuits for processing of the image information produced by the infrared sensor.

The image information provided by the InSb or HgCdTe infrared photosensor is normally in the form of a low amplitude current or small packets of charge.

Because of the incompatibility between the infrared sensor material and the silicon of the readout system, the image sensor and the readout system are normally separately fabricated on different substrates (respectively, InSb or HgCdTe and silicon). In a system, the photodetector or focal plane array and the readout circuits are normally mounted on a common substrate or circuit board and interconnected by wire bonds to form a sensor hybrid. Such wire bonds are also referred to as flying leads because they are secured only at their opposite ends where they are bonded to the photodetector and the integrated circuit, respectively. Where particularly fine resolution is desired, even the relatively thin flying lead and its minimum lead-to-lead spacing become a limitation on sensor array density. This is because even with state-of-the-art wire bonding equipment, wire bonds cannot be made closer together than about 2.5 mils, center-to-center, and because of the need to allow sufficient space between adjacent wire bonds to ensure against the creation of intermittent or permanent short circuits during normal use as a result of vibration or other phenomena. Such fine, closely spaced wire bond connections are easily damaged by accidental contact. Consequently, once wired, such focal plane array sensor hybrids must be handled extremely carefully to prevent damage to them. A further and significant problem in applications where the system is subjected to significant vibration, is the tendency of the flying leads to vibrate which results in additional noise in the system (known as microphonics) and which can lead to unintentional short circuits among adjacent wires.

Initially, focal plane array yield with InSb was a significant problem even with linear arrays, however, the yield of such linear arrays is now high enough that the testing of such arrays no longer presents a problem.

In contrast, with two dimensional InSb arrays, there is still a significant yield problem in the form of excessive numbers of so-called dead pixels or cells which provide no output, provide a constant output or provide a very noisy output. A more significant problem where tight tolerance is required on noise specifications, is the difficulty of determining the noise characteristics of individual cells of a focal plane array prior to connection of that focal plane array in a system. During wafer test of a two dimensional focal plane array, it is possible to determine whether or not entire rows or columns of cells are dead or inactive. However, it is impossible to determine the presence of individual (i.e. isolated or randomly positioned) bad pixels or the degree of noise generation or noise susceptibility of individual pixels.

Because of the hybrid nature of a focal plane array sensor hybrid in which the focal plane array itself and its readout system are fabricated from different semiconductor materials, it is impossible to fully test a two dimensional focal plane array prior to connecting it to its silicon readout circuitry. All present connection technologies for connecting an infrared focal plane array chip to silicon readout circuitry are non-repairable in the sense that once wire bonds have been connected from the focal plane array chip to a silicon readout chip, that focal plane array chip and those silicon readout chips cannot be rewired as by removing those wire bonds and rewiring any of those chips with new wirebonds in a production environment. However, in a laboratory situation, we have reworked wirebonded InSb and silicon chips with some success. However, this is risky, has a low probability of success and is not considered acceptable for production systems. As a consequence, when a focal plane array is connected to a readout system (which is normally a multiplexer), it becomes committed to use with those readout chips. In the event that the entire combination of the focal plane array and the readout chips does not meet specifications, the entire combination must be discarded. At present, this is an expensive proposition both because of the initial cost of the focal plane array and the silicon readout circuit chips and because of the further cost associated with the substrate on which the focal plane array and the silicon circuits are mounted for interconnection among themselves and to the remainder of the system for ultimate system use. It is only when the readout multiplexers have been connected to the infrared sensor array that the presence of individual bad pixels can be absolutely determined.

The hybrid board on which the focal plane array and the readout multiplexing circuits are mounted has a much larger area than the focal plane array itself. Because of the wire bond techniques used to connect the focal plane array to the readout multiplexers, these chips must always be disposed in a common plane. As a result, the dewar in which the focal plane array sensor hybrid is mounted must be substantially larger than it would have to be if only the focal plane array were mounted in the dewar. In size and weight sensitive systems, especially such systems intended for airborne or space application, the large dewar size is a substantial drawback both because if its own size and weight and because of the increased heat load which it places on the cooling system. This, in turn, requires a large cooling system than would be required if a smaller dewar could be used. Consequently, any advance in focal plane array sensor hybrid construction which enables the area occupied by a focal plane array sensor hybrid to be reduced, offers a multiplication of advantages in the form of system size and weight reduction as compared to prior art systems.

After assembly into the overall focal plane array sensor hybrid, the entire hybrid is mounted in a cryogenic dewar and cooled to a temperature in the vicinity of 78° to 82° K. and subjected to a test which is known as the "zero degree field of view" test. In this test, external infrared illumination is excluded from the focal plane array. The focal plane array is then read out using the silicon multiplexer readout circuitry to detect the presence of leaky or noisy pixels in the array. For a 128 by 128 cell array (which has 16,384 pixels), a specification such as a maximum of 0.5% dead pixels limits the array to only 82 dead pixels in the entire array. Where noisy or leaky pixels are considered dead pixels, this puts stringent requirements on the focal plane array. More significantly, it is this small percentage which makes it necessary to connect the focal plane array to its readout multiplex circuits prior to performing this test. Assuming that the focal plane array sensor hybrid passes this zero degree field of view test, additional tests such as flood illumination combined with cell-to-cell uniformity determinations are performed as part of the acceptance test for such a focal plane array.

Because of the inability to rework the connections among the focal plane array and its silicon readout circuits, a complete focal plane array sensor hybrid which fails its acceptance tests must be scrapped even if all of its components except one is acceptable. Discarding such a system is expensive.

An additional cost associated with this assembly technique and test system is the fact that the focal plane array sensor hybrids must be individually mounted and cooled for testing with the result that substantial expense is involved in the testing alone.

Consequently, there is a need for an improved test and connection structure for such focal plane array sensor hybrids which will enable effective testing and repair and lead to substantial reductions in testing costs.

A high density interconnect (HDI) structure or system which has been developed by General Electric Company offers many advantages in the compact assembly of electronic systems. For example, an electronic system such as a micro computer which incorporates 30–50 chips can be fully assembled and interconnected on a single substrate which is 2 inch long by 2 inch wide by 0.050 inch thick. Even more important, this interconnect structure can be disassembled for repair or replacement of a faulty component and then reassembled without significant risk to the good components incorporated within the system. This is particularly important where as many as 50 chips having a cost of as much as $2,000.00, each, may be incorporated in a single system on one substrate. This repairability is a substantial advance over prior connection systems in which reworking the system to replace damaged components was either impossible or involved substantial risk to the good components.

Briefly, in this high density interconnect structure, a ceramic substrate such as alumina which may be 100 mils thick and of appropriate size and strength for the overall system, is provided. This size is typically less than 2 inches square. Once the position of the various chips has been specified, individual cavities or one large cavity having appropriate depth at the intended locations of differing chips, is prepared. This may be done by starting with a bare substrate having a uniform thickness and the desired size. Conventional or laser milling may be used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C. depending on the formulation used) and then cooled to thermoplastically bond the individual components to the substrate. Thereafter, a polyimide film which may be Kapton ® polyimide, available from E.I. du Pont de Nemours Company, which is =0.0005-0.003 inch (=12.5-75 microns) thick is pretreated to promote adhesion and coated on one side with the ULTEM ® polyetherimide resin or another thermoplastic and laminated across the top of the chips, any other components and the substrate with the ULTEM ® resin serving as a thermoplastic adhesive to hold the Kapton ® in place. Thereafter, via holes are laser drilled in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a scanned laser to provide an accurately aligned conductor pattern at the end of the process.

Additional dielectric and metallization layers are provided as required in order to provide all of the desired electrical connections among the chips. Any misposition of the individual electronic components and their contact pads is compensated for by an adaptive laser lithography system which is the subject of some of the Patents and Applications which are listed hereinafter.

In this manner, the entire interconnect structure can be fabricated from start to finish (after definition of the required conductor patterns and receipt of the electronic components) in as little as =8-12 hours.

This high density interconnect structure provides many advantages. Included among these are the the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This milling process is straightforward and fairly rapid with the result that once a desired configuration for the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1988, entitled "Method and Apparatus for Removing Components Bonded to a Substrate" by R. J. Wojnarowski, et al.; U.S. Pat. No. 4,894,115 issued Jan. 16, 1990 entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. Pat. No. 4,878,991, issued Nov. 7, 1989, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. Pat. No. 4,019,946 issued May 28, 1991 entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. Pat. No. 4,960,613, issued Oct. 2, 1990, entitled "Laser Interconnect Process" by H. S. Cole, et al.; U.S. Pat. No. 4,884,122, issued Nov. 28, 1989, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 18, 1988, entitled "Direct Deposition of Metal Patterns for Use in Integrated Circuit Devices" by Y. S. Liu, et al.; U.S. Pat. No. 4,882,200 issued Nov. 21, 1989 entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S.

Pat. No. 4,933,042 issued Jun. 12, 1998 entitled "Method and Apparatus for Packaging Integrated Circuit Chips Employing a Polymer Film Overlay Layer" by C. W. Eichelberger, et al.; U.S. Pat. No. 4,897,153, issued Jan. 30, 1990 entitled "Method of Processing Siloxane-Polyimides for Electronic Packaging Applications" by H. S. Cole, et al.; U.S. Pat. No. 4,988,412 issued Jan. 29, 1991 entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermet Density Interconnected Electronic System" by W. P. Kornrumpf, et al.; U.S. Pat. No. 5,040,047, issued Aug. 13, 1991 entitled "Enhanced Fluorescence Polymers and Interconnect Structures Using Them" by H. S. Cole, et al.; and U.S. patent application Ser. No. 454,545, filed Dec. 21, 1989, entitled "An Epoxy/Polyimide Copolymer Blend Dielectric and Layered Circuits Incorporating It" by C. W. Eichelberger, et al. Each of these Patents and Patent Applications is incorporated herein by reference.

This high density interconnect system has been developed for and applied to the military digital system temperature range of −55° C. to +150° C. However, its suitability for use at cryogenic temperatures such as 77° K. (the boiling point of liquid nitrogen) have not been established. Concerns associated with possible application of this system to such temperatures include the integrity of the various dielectric layers, both at these temperatures and during transitions from room temperature to these temperatures and the effects of thermal contraction of the various dielectric layers and conductors during cooling from room temperature to these cryogenic temperatures.

Another problem with this high density interconnect structure is the fact that it applies its dielectric layer over the entire system it is to interconnect and the polyimide and polyetherimide materials which serve as its dielectric material exhibit substantial absorbence of the infrared frequencies of interest in InSb and HdCdTe infrared sensing systems. Even the 0.5 to 3 mil thick layers of these materials which are employed as the initial dielectric layer in this high density interconnect structure can attenuate infrared signals of interest in focal plane array work by as much as 30% or more.

A further problem with respect to use of this high density interconnect structure with infrared focal plane arrays is that the 220° C. processing temperatures for this high density interconnect structure using the ULTEM polyetherimide resin as the thermoplastic adhesive is much too high for use with InSb and HgCdTe focal plane array The above-identified related application Ser. No. 07/504,821 discloses the removal of the dielectric layers of the high density interconnect structure over dielectric-constant-sensitive portions of a microwave circuit to minimize high density interconnect structure/component interactions in a microwave system.

Consequently, there is a need for a more accommodating connection system for connecting focal plane arrays to their readout circuits.

OBJECTS OF THE INVENTION

Accordingly, a primary object of the present invention is to provide a focal plane array sensor hybrid which is more rugged than prior art focal plane array sensor hybrids.

Another object of the present invention is to provide a focal plane array sensor hybrid interconnection system which allows reworking of the interconnections, including removal and replacement of faulty chips.

Another object of the present invention is the provision of a focal plane array sensor hybrid which can be mounted in a smaller dewar than prior art systems.

Still another object of the present invention is the provision of a focal plane array sensor hybrid high density interconnect structure which can be fabricated without exposing focal plane array chips to temperatures which degrade their performance.

A further object of the present invention is to provide a focal plane array sensor hybrid structure which requires a much smaller area than corresponding prior art sensor hybrids.

A still further object of the present invention is to minimize thermal interactions between the focal plane array and the readout circuitry.

SUMMARY OF THE INVENTION

The above and other objects which will become apparent from the specification as a whole, including the drawings, are achieved in accordance with the present invention by interconnecting the focal plane array and its readout circuitry with a high density interconnect structure comprising a layer of dielectric material bonded to the focal plane array chip and the readout chips and a plurality of interconnecting conductors disposed on the layer of dielectric material. Preferably, this high density interconnect structure is fabricated with a low temperature (<150° C.) process and is rendered flexible in its portion between the focal plane array and its readout circuitry in order that the readout chips may be disposed adjacent the sides of the expander of the dewar rather than being disposed at the end of the expander along with the focal plane array.

The dielectric material of the high density interconnect structure is preferably removed from the radiation sensitive portion of the focal plane array to maximize the sensitivity of the focal plane array sensor hybrid to the desired infrared radiation.

Multiple focal plane array sensor hybrids may be tested at the same time by mounting them on a common substrate and employing a common high density interconnect structure to interconnect the focal plane arrays and their readout circuits. This test assembly may then be cooled as a unit and all of the focal plane array sensor hybrids tested during a single cooling cycle. Following testing, each acceptable focal plane array sensor hybrid is excised, as a unit, from the common high density interconnect structure for mounting in a final system. The cause of failure of unacceptable focal plane array sensor hybrids is determined, the high density interconnect structure is removed from the test fixture and the non-acceptable sensor hybrids, faulty components in those sensor hybrids are removed and replaced and the locations occupied by excised acceptable sensor hybrids are populated with additional untested focal plane array sensor hybrids. A new high density interconnect structure is then applied to the fixture to interconnect the various focal plane arrays with their readout circuitry and the testing process is repeated. As a result, no good components are discarded and both fabrication and testing costs are minimized. The area occupied by a focal plane array sensor hybrid during testing is much less than that occupied by a prior art sensor hybrid during testing because the sensor hybrid in accordance with the present invention is not yet mounted on its system board.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 10 illustrates a modified configuration for a FIG. 7 focal plane array sensor hybrid.

DETAILED DESCRIPTION

Figure 1:
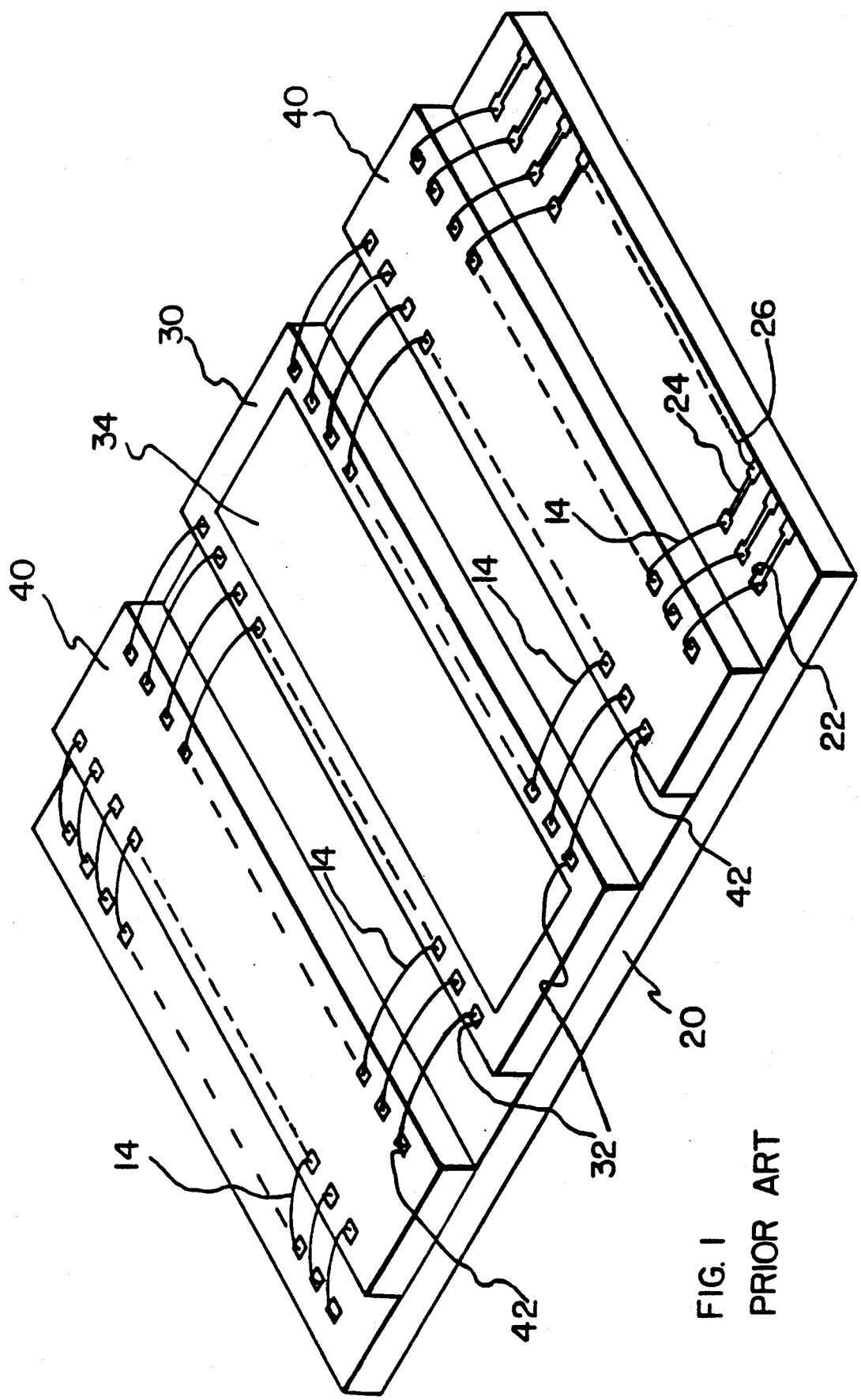
FIG. 1 is a perspective view of a prior art linear focal plane array.

In FIG. 1, a prior art linear focal plane array sensor hybrid 10 is illustrated in a perspective view. The hybrid 10 comprises a substrate in the form of a printed circuit board 20 including a pattern of printed wiring. The printed wiring includes printed contact pads 22 which are connected by printed wires 24 to printed contact tabs 26. The contact pads 22 are for wire bond connections to the readout circuitry for the focal plane array chip. The contact tabs 26 are for connection to external circuitry via a tape cable 28 (FIG. 2) which will be parallel gap welded to these contact pads. The tabs 26 are positioned on the same centers as the conductors of the tape cable to facilitate such welding. The printed circuit board 20 may include internal layers of conductors for interconnecting the various contact pads 22 and external connector tabs 26 in an appropriate manner.

A focal plane array chip 30 is bonded to the upper surface of the printed circuit board 20. The focal plane array chip 30 has a plurality of contact pads 32 disposed along the long edges thereof. These contact pads 32 are connected to individual cells of the focal plane array which are disposed in the optically active portion 34 of the chip 30. The contact pads 32 are typically positioned much closer together than the contact pads 22 on the printed circuit board 20. The chip 30 may be, for example, InSb, HgCdTe or any other imager material, as may be appropriate to the purpose of the system. Disposed adjacent to each of the long sides of the chip 30 is a silicon readout chip 40 having contact pads 42 on its upper surface. The chips 40 are multiplexer circuits which serve to couple the signals from the focal plane array chip 30 to the rest of the system in a low noise, high efficiency manner. Separate silicon readout chips are used rather than integrating the multiplexers into the focal plane array chip 30 because integration of the readout function in the focal plane array chip is not feasible at this time where the focal plane array chip is InSb or HgCdTe. The readout chips 40 are connected to the focal plane array chip 30 by a plurality of wire bonds 14 which are typically 1 mil diameter wire disposed on 2.5 mil centers and 60-80 mils long. A typical linear focal plane array having 256 cells requires 258 wire bonds for its connection to its readout chips. The readout chips are, in turn, connected to the contact pads 22 on the printed circuit board 20 by a plurality of wire bonds 14.

This structure, although effective for its purpose, has a number of drawbacks. First, the wire bonds 14 are easily damaged, broken or displaced to create undesired short circuits. Second, when the focal plane array sensing system is disposed in a vibration prone environment, the wire bonds or flying leads 14 are subject to vibration which can also result in undesired short circuits, lead breakage and electrical noise generation effects. Third, although removal and reattachment of a wire bond is possible, it is not feasible for a significant number of wire bonds or in a production environment.

For a linear focal plane array chip which is 100 to 200 mils wide by 700-1200 mils long, the printed circuit board 20 is typically 1 to 1.5 inches by 1 to 1.5 inches. Thus, the hybrid structure 10 is substantially larger than the focal plane array chip 30.

Figure 2:
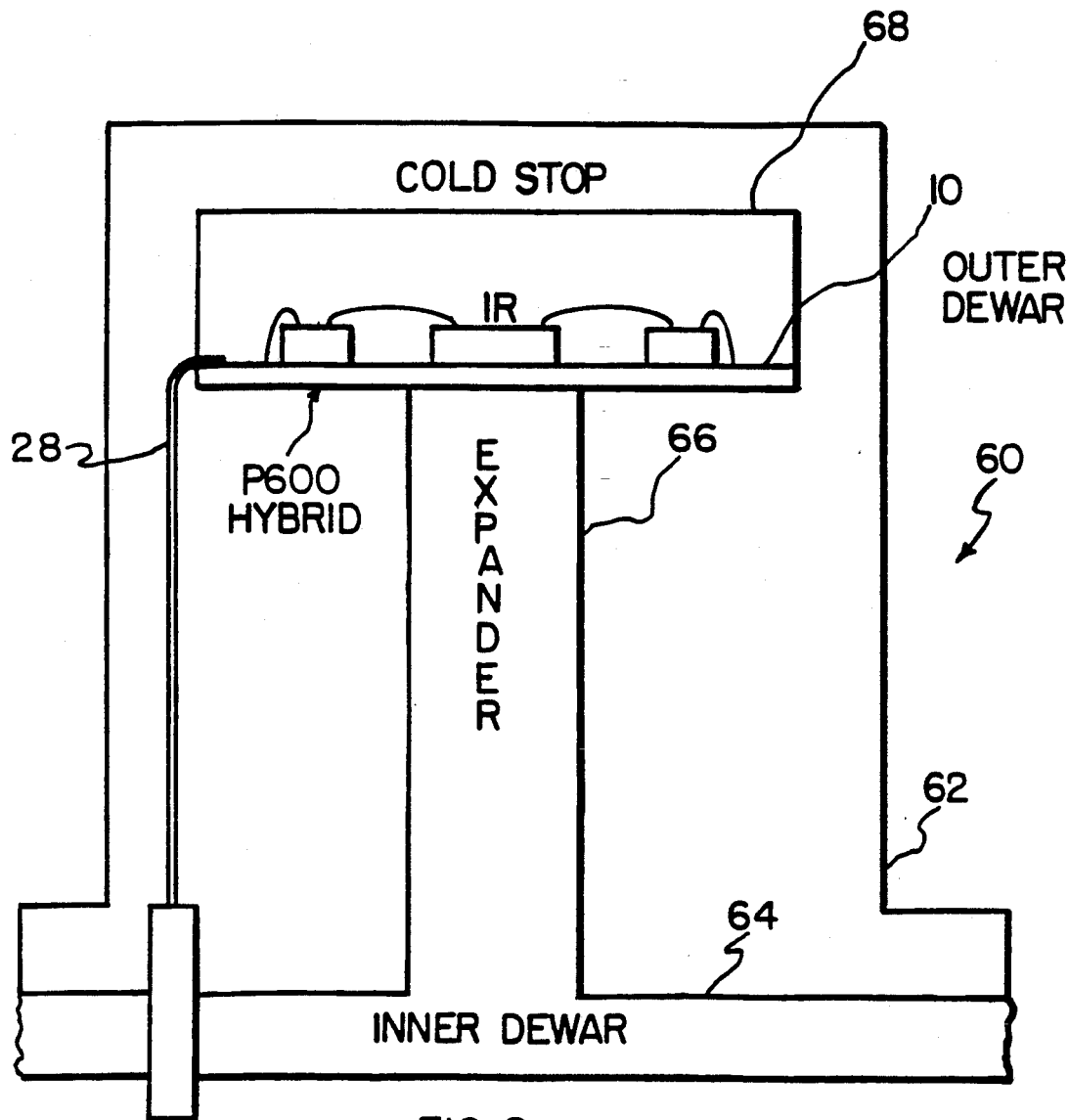
FIG. 2 is an elevation view of a prior art cryogenic dewar containing a prior art focal plane array.

FIG. 2 is an elevation view of the focal plane array sensor hybrid 10 mounted in a system 60. The system 60 includes an outer cryogenic dewar 62 and an inner cryogenic dewar 64. The outer dewar is evacuated to a high vacuum to minimize thermal conduction of the heat of the ambient environment to the inner dewar 64. The inner dewar 64 includes an expander column 66 on which the focal plane array sensor hybrid is mounted. The expander is typically held at a temperature of 77° K. (the boiling point of liquid nitrogen). The hybrid 10 is enclosed by a cold stop 68 whose purpose is to insulate the focal plane array sensor hybrid from the relatively high temperature (293° to 368° K.—20° to 95° C.) of the outer dewar 62 during use. The hybrid 10 is electrically connected to the outside world via a tape cable 28 which extends through a feedthrough in the dewars. In operation, it is desired to hold the focal plane array chip at a temperature of in the range from about 65° K. to 77° K. Consequently, the inner dewar is cooled by liquid nitrogen which expands to form nitrogen gas within the expander 66 or a Stirling closed cycle cooler. The focal plane array is disposed in thermal contact with expander 66 via the circuit board 20. A typical operating temperature for the focal plane array in such a configuration is in the range from 65° to 82° K. The wall of the outer dewar is usually at a system dependent temperature.

The system 60 presents a substantial cooling load. This cooling load has two components, the electrical dissipation of the focal plane array chip and the associated readout chips and the infrared radiation heating of the dewars. The entire exterior surface is subject to heating by infrared radiation impinging thereon. In order to hold the focal plane array at the desired temperature, all of the electrical dissipation energy and thermal energy incident on the dewars must be extracted by the cooling system. Since external heating of the dewars is proportional to the exposed surface area of the dewars, reducing the size of the dewars would reduce the cooling load and thereby enable a smaller cooling system to be employed.

Figure 3:
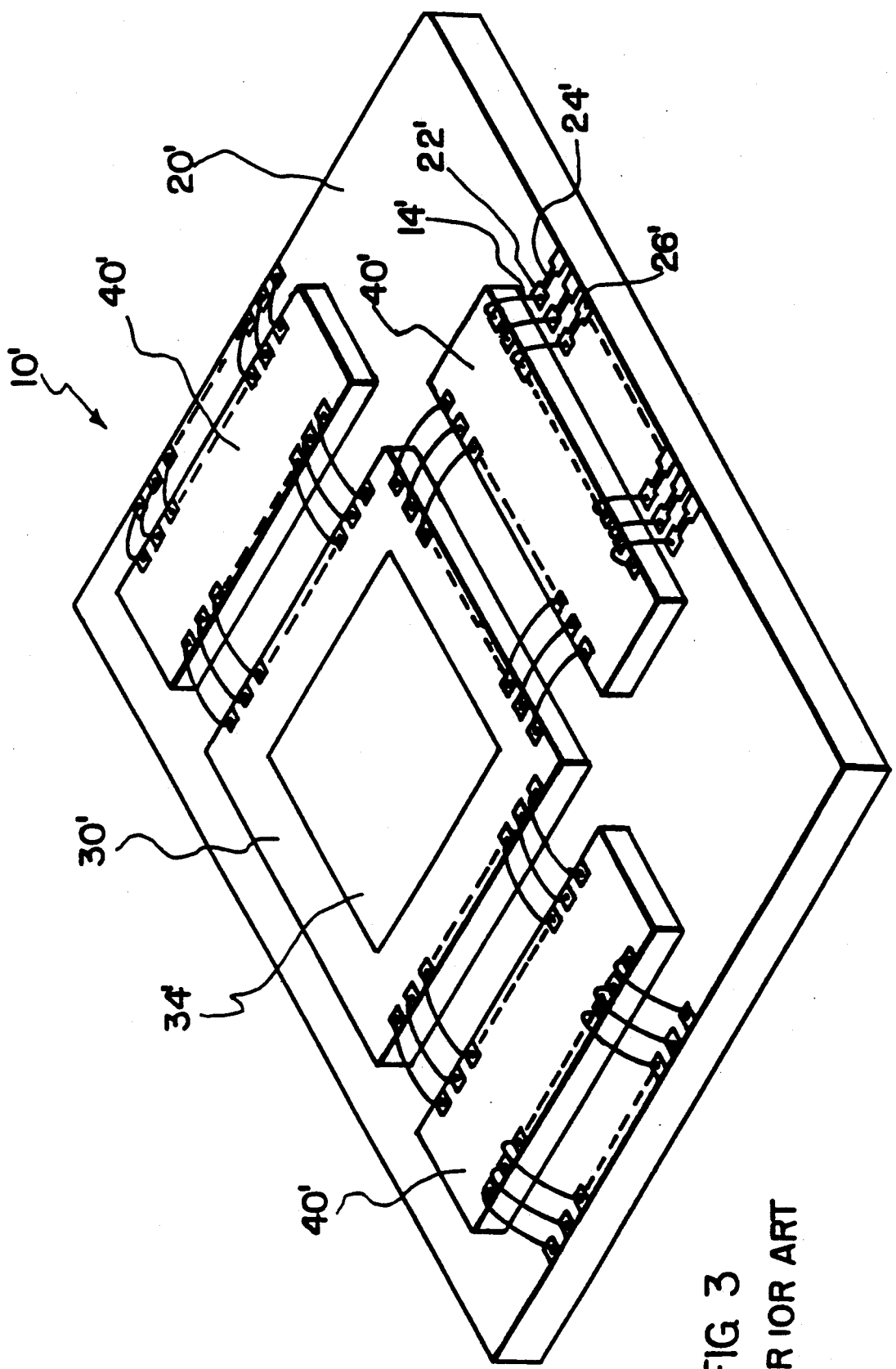
FIG. 3 is a perspective illustration of a prior art two dimensional focal plane array.

In FIG. 3, an alternative prior art focal plane array system 10' is illustrated. The system 10' is similar to the system 10 except that the focal plane array chip 30' contains a two dimensional focal plane array in its active area 34' rather than the linear array of the chip 30. A two dimensional focal plane array of this type may typically be rectangular with 128 elements along each side, for a total of 16,384 elements. In order to process the images produced by the two dimensional array chip 30', three readout chips 40' are used, with one mounted adjacent to each of three sides of the focal plane array chip 30'. The readout chips 40' are connected to the focal plane array chip 30' by wire bonds 14'. A two dimensional focal plane array hybrid structure of the type illustrated in FIG. 3 may typically employ a focal plane array chip which is 500 mils by 500 mils and may have an overall printed circuit board dimension of 1.5 inches by 1.5 inches.

A major disadvantage of this assembly technique for the two dimensional focal plane array is the fact that wire bond connections of this type cannot be reliably removed and replaced without a substantial risk of damage to the contact pads of the focal plane array and readout chips, especially in a production environment. Consequently, once a focal plane array chip 30' and its readout chips 40' have been bonded to the printed circuit board 20' and interconnected with wire bonds, this sensor hybrid either passes inspection or is scrapped. This introduces a substantial cost since the printed circuit board itself is expensive as are each of the chips mounted thereon. When the entire hybrid must be scrapped, all of the expense of producing that hybrid and its good chips is wasted.

Unlike the linear focal plane array chip 30 of FIG. 1, the focal plane array chip 30' of FIG. 3 can not be adequately tested prior to mounting and wire bonding the chips to each other and the printed circuit board. Pretesting can detect those two-dimensional focal plane array chips which have an entire row or an entire column which is inoperative. However, the presence of individual, isolated or randomly located inoperative pixels cannot be determined by such prior-to-wirebonding testing.

A typical yield at room temperature for row and column screening tests for such two-dimensional focal plane array chips is in the range from 20 to 35%. Of the two-dimensional focal plane array chips which pass these preliminary or screening tests, only about 40% pass the final tests as part of a sensor hybrid. This 40% yield means that 60% of the assembled hybrids must be scrapped or reworked at substantial direct and long term reliability risk.

Figure 4:
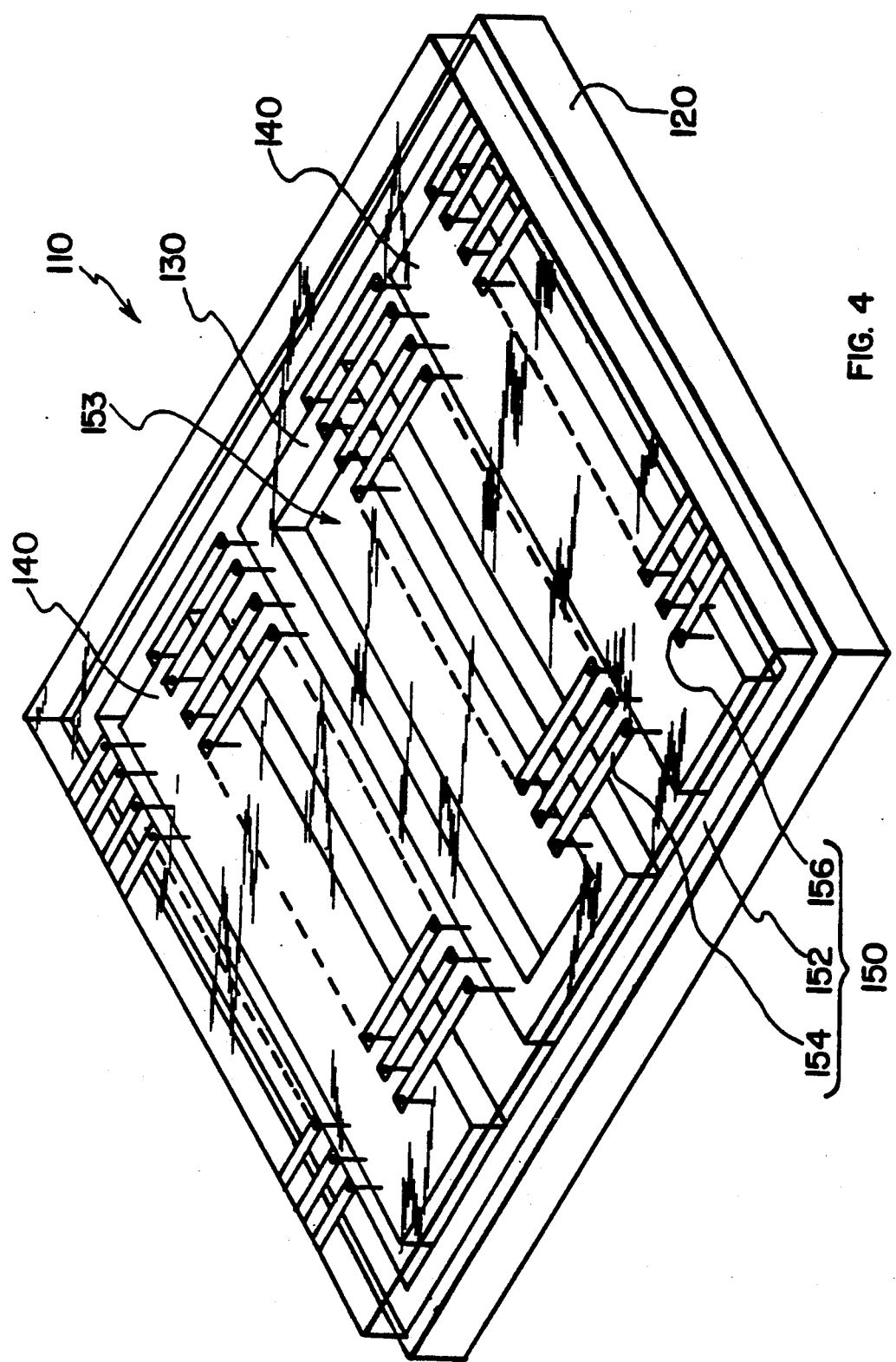
FIGS. 4-7 are perspective illustrations of focal plane array sensor hybrids in accordance with the present invention.

In FIG. 4, a linear focal plane array sensor hybrid 110 in accordance with the present invention is illustrated in a perspective view. The sensor hybrid 110 comprises a substrate 120 having a linear focal plane array chip 130 and two readout chips 140 mounted on the upper surface thereof. A high density interconnect structure 150 is disposed on the upper surface of the substrate 120 and the chips 130 and 140 and serves to electrically interconnect the chips. The interconnect structure 150 comprises a layer of dielectric material 152 which is laminated to the upper surface of the substrate 120 and the chips. This dielectric layer may preferably be Kapton ® polyimide which is bonded to the substrate and chips by a polyester dielectric layer. An appropriate polyester coated polyimide may be obtained from Sheldahl Corporation under their catalog number T-320, with the adhesive being referred to as a A-28 adhesive. This polyester thermoplastic adhesive is used in the fabrication of this sensor hybrid in order that the high density interconnect structure fabrication temperatures may be kept below 200° C. in order to avoid thermal damage to the InSb focal plane array chip 130. The preferred lamination temperature using this polyester thermoplastic adhesive 150° C. This polyester material is preferably rendered laser ablatable at 351 nm by the inclusion of an appropriate dye in the polyester as taught in U.S. patent application Ser. No. 07/456,421 entitled "Laser Ablatable Polymer Dielectrics and Methods" by H. S. Cole et al., filed Dec. 26, 1989. That application is incorporated herein by reference. Rendering this polyester ablatable at 351 nm enables the entire high density interconnect structure fabrication process to be performed with a laser operating at 351 nm. We have established by exposing test structures to liquid nitrogen temperature (77° K.) followed by disposition on a hot plate at 150° C. followed by return to liquid nitrogen temperatures that this high density interconnect structure is suitable for use at liquid nitrogen temperatures. Only insignificant variations in resistance of a test vehicle resulted from 1000 cycles between liquid nitrogen and 150° C. One ohmic contact resistance sample had an initial value of 23.5 ohms, a final value of 23.1 ohms and varied between 22.9 and 23.2 ohms when measured at intermediate points in this test. Another resistance sample had an initial value of 30.2 ohms, a final value of 30.4 ohms and varied between 29.7 and 30.4 ohms when measured at intermediate points in this test. These are all considered acceptable values.

A patterned conductive layer including conductors 154 and 156 is disposed on the upper surface of the dielectric layer 152. Each conductor 154 connects one contact pad on the focal plane array chip 130 to one contact pad on a readout chip 140. The conductors 154 connect to these contact pads by extending into via holes in the dielectric layer 152. These via holes are preferably laser drilled prior to deposition of the metal which forms the conductors 154. The conductors 156 are connected to individual contact pads on the readout chips 140 and serve as output contacts for the hybrid 110. The contacts 156 may have a tape cable bonded (preferably welded) to them, if desired, or may serve as an edge connector for connection to a socket. The hybrid 110 may be directly substituted for the prior art hybrid 10.

It will be noted, that this interconnection structure includes unique features when fabricated by first forming the dielectric layer on the underlying structure, then forming the via holes by "drilling" from above in the dielectric layer and then depositing the metal of the conductors 154 and 156. In particular, the external configuration of the metal in the via hole takes on the shape of the via hole, rather than vice versa as would be the case if the metal in the via hole were formed first and the dielectric filled in around it. The laser drilling from the top process typically results in a via hole which is wider at the top than at the bottom because of the nature of the laser drilling process. This via hole shape also provides improved metal continuity between the portion of a conductor which is disposed in a via hole and the portion which is outside the via hole, since the via hole+s wall surface on which the metal is deposited has a sloping-upward-and-outward configuration. Such a wall configuration is known from the semiconductor arts to provide a deposited metallization layer with better step coverage than is provided by a vertical wall surface. Further, when made in the preferred manner described in the background Patents and Patent Applications, the upper surface of the metal conductor typically has a depression or dimple in it over the via hole because the metal is deposited to a substantially uniform thickness rather than up to a particular plane.

The dielectric layer 152 has an aperture or window 153 disposed therein in alignment with the optically active portion of the focal plane array chip 130. The aperture 153 is formed after completion of the high density interconnect structure fabrication process by laser ablation or other removal of the dielectric material 152 from that region. The dielectric material is removed from this region because even a layer of Kapton ® as thin as 0.5 to 3 mils, attenuates the infrared radiation to which the focal plane array chip is sensitive by as much as 30%.

This hybrid 110 in accordance with the present invention has a number of substantial advantages over the prior art hybrid. First, the hybrid 110 is free of flying leads. Consequently, it is not subject to damage by bending or breaking of flying leads and is free of any vibration effects such as microphonics because the conductors 154 and 156 are fixed by their adherence to the dielectric layer 152. Further, the conductor pattern on the dielectric layer 152 can be automatically fabricated as a unit rather than each conductor having to be individually placed and connected as in the prior art, wire-bonded structure. Consequently, the fabrication process is substantially simpler. Further, in the event that during testing the hybrid 110 is found to not meet specifications, the high density interconnect structure 150 and any faulty chips may be removed from the substrate 120. Replacement chips are then mounted on substrate 120 in place of the faulty chip or chips and a new high density interconnect structure is formed thereover to create a repaired focal plane array sensor hybrid. This repaired hybrid may then be tested and if found satisfactory, may be used in a system. In the event that it still is not acceptable, it may be reworked as required until it is acceptable. In this way no acceptable chips have to be discarded along with faulty chips.

Figure 5:
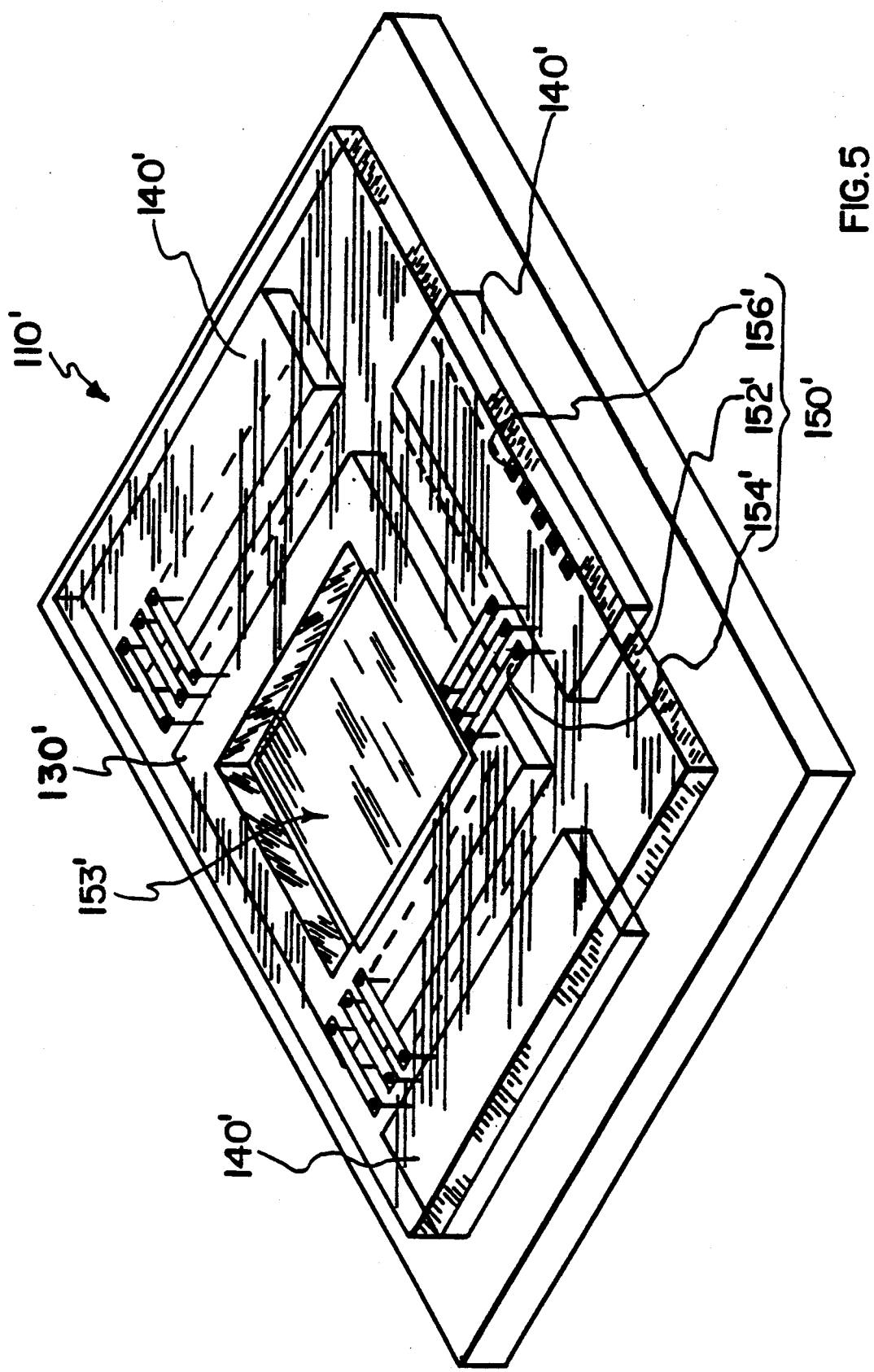

In FIG. 5, a focal plane array sensor hybrid 110' including a two dimensional focal plane array chip, is illustrated in perspective view. The hybrid 110' is similar to the hybrid 110 except for the configuration of the focal plane array chip 130' and the number and location of the readout chips 140' which are connected to the focal plane array chip 130'.

Figure 6:
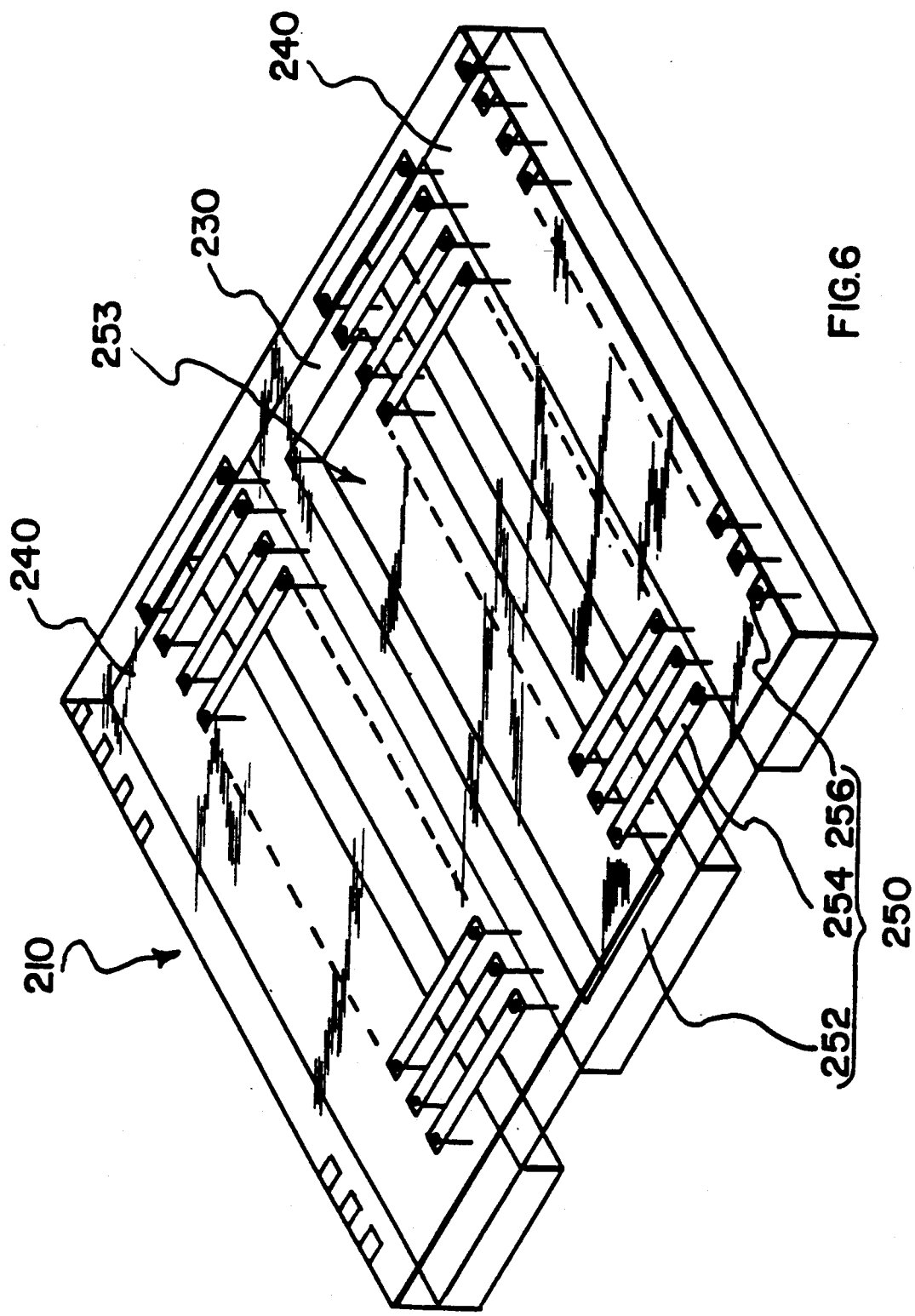
Figure 7:
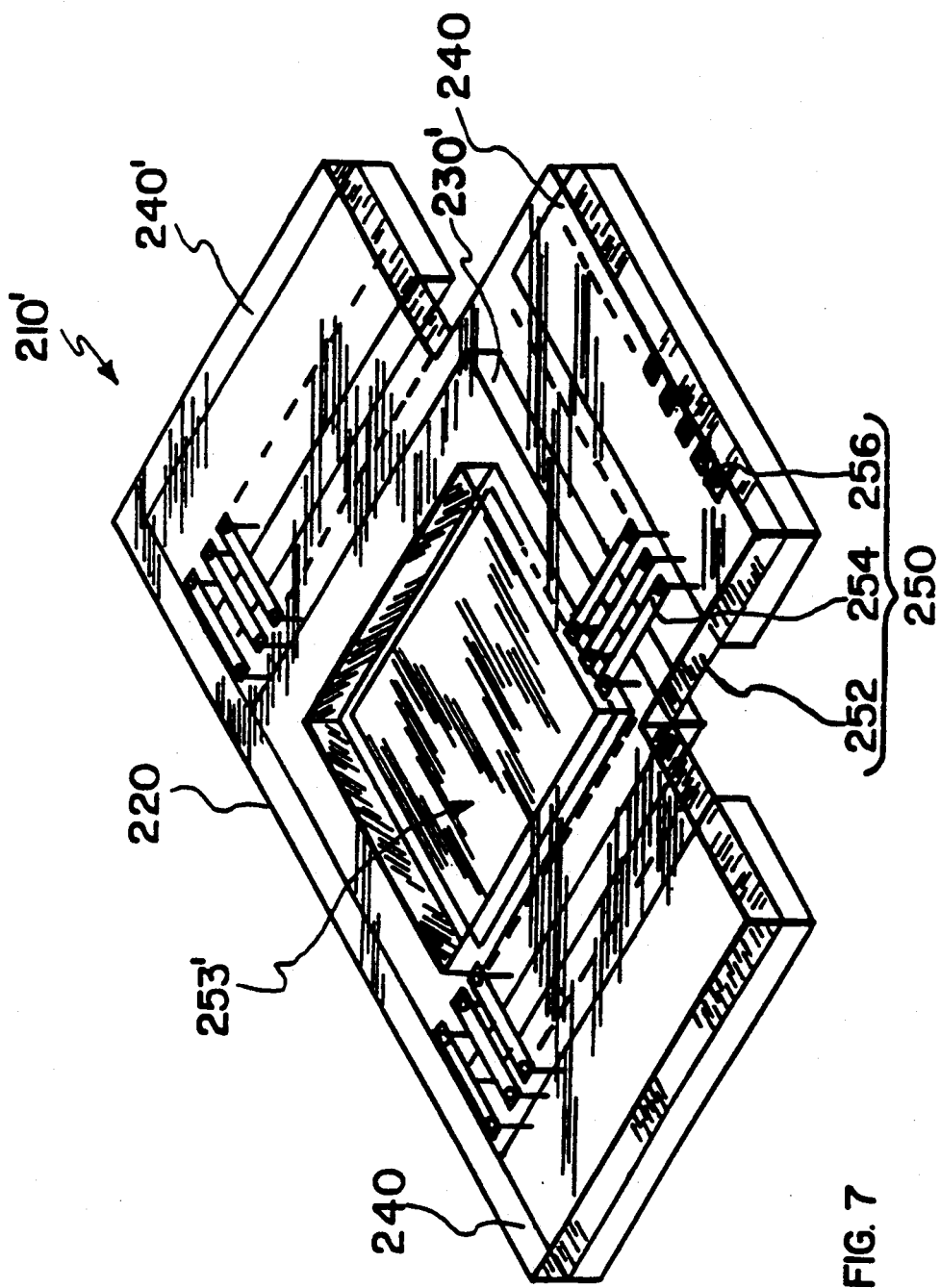

While the focal plane array sensor hybrids 110 and 110' both have substantial advantages over the prior art hybrids 10 and 10', they still suffer from the disadvantage of being relatively large compared to the size of the focal plane array chip 130 or 130'. Focal plane array sensor hybrids 210 and 210' which overcome this problem, are illustrated respectively in FIGS. 6 and 7. The focal plane array sensor hybrids 210 and 210' are similar to the hybrids 110 and 110', respectively, except that the focal plane array chip 230 or 230' is not on the same substrate as the associated readout chip 240 or 240' (there is no common substrate such as the FIG. 4 substrate 120) to allow bending of the inherently flexible high density interconnect structure between the focal plane array chip 230 or 230' and its associated readout chips 240 or 240' in accordance with the teachings of related U.S. patent application Ser. No. 07/504,769. As is explained in that application, flexible portions of the high density interconnect structure preferably have support members in the structure between the focal plane array chip and each of its readout chips prior to laminating the dielectric layer 252 or 252' to the chips and substrate. The support members may preferably be Kovar ® or another low expansion coefficient metal whose thermal coefficient of expansion closely matches that of an alumina substrate. This is to facilitate manufacture of this interconnect structure by assuring that differences in thermal coefficients of expansion do not interfere with proper fabrication of the structure. Further, use of ferric chloride as an etchant to remove Kovar is compatible with the rest of the high density interconnect structure materials and process steps. Kovar is readily available in 10-20 mil thicknesses which are thicker than necessary for this use and stiff enough that a thinner sheet or foil or Kovar is desirable for bending. Following completion of the high density interconnect structure fabrication process, the chips and the temporary support members are removed from their fabrication carrier. Where the temporary support members are thin enough, the system may be used in that configuration. However, where the support members are undesirably rigid, they may be uniformly or selectively thinned or completely or selectively removed to leave the aligned portions of the high density interconnect structure 250 or 250' flexible with the result that the readout or support chips 240 or 240' may be disposed in a different plane than the focal plane array chip 130 or 130'.

Figure 8:
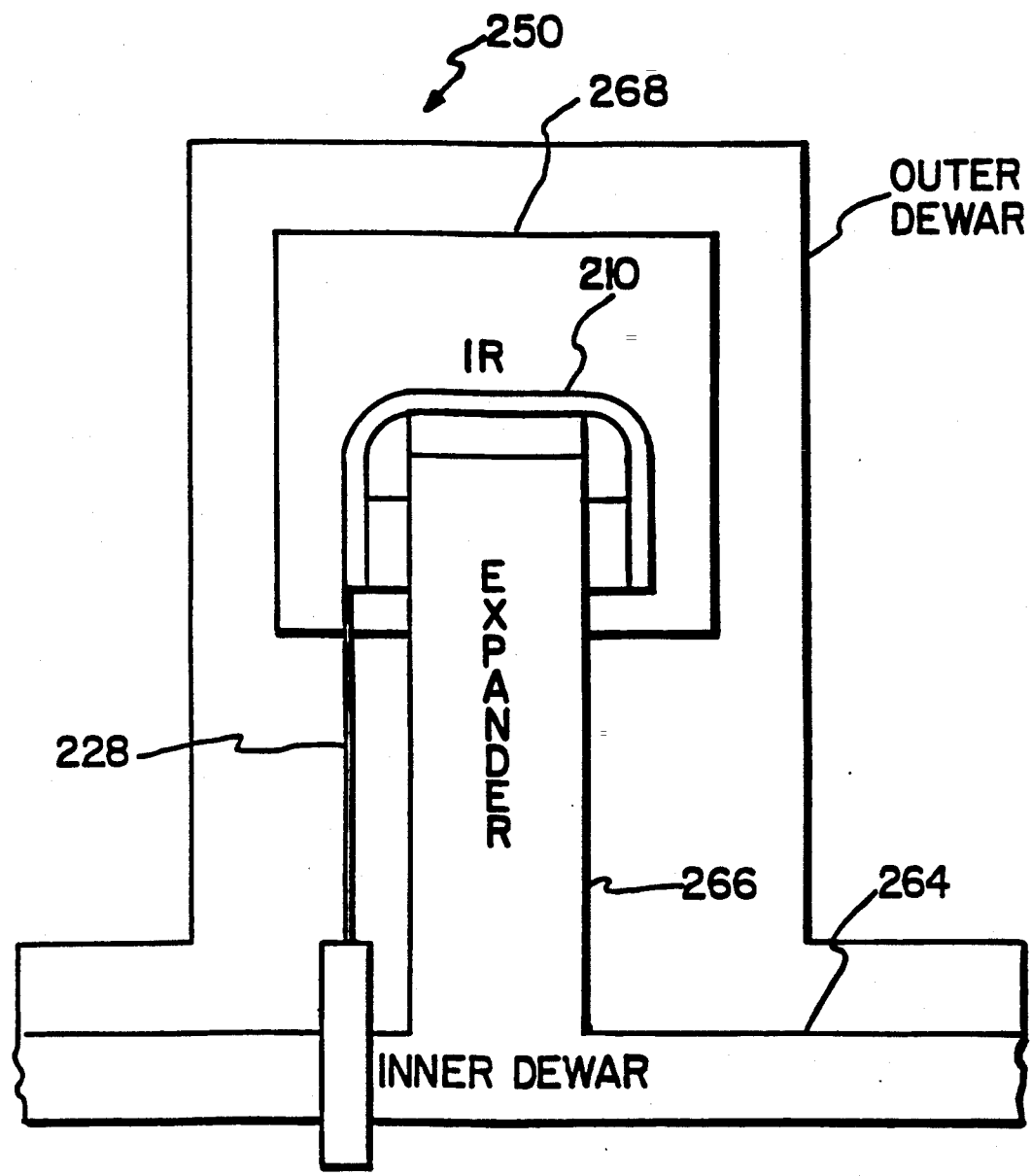
FIG. 8 is an elevation view of a dewar containing a focal plane array sensor hybrid in accordance with the present invention of the type illustrated in FIG. 6 or 7.

In FIG. 8, a focal plane array sensor hybrid 210 or 210' is illustrated in an elevation view mounted in a system 260. As compared to the system 60, the cold stop 268 and the outer dewar 262 are both substantially smaller than the corresponding structures in the system 60. This is because the cold stop only needs to be as wide as the expander or the focal plane array chip itself. This smaller cold stop allows the outer dewar 262 to be substantially smaller also. This reduces the surface area of the dewar, thereby reducing the heat load on the cooling system and allowing the cooling system itself to be made smaller and lighter. While the readout chips 240 or 240' may be supported solely by the high density interconnect structure 250 or 250', it is preferred to provide a separate means of supporting the readout chips in order to minimize the risk of damage to the system due to vibration, acceleration, and so forth.

A further substantial advantage of the flexible high density interconnect version of this focal plane array sensor hybrid is that it can substantially reduce the time required to test the sensor hybrid and may significantly reduce the cost of such testing.

Figure 9:
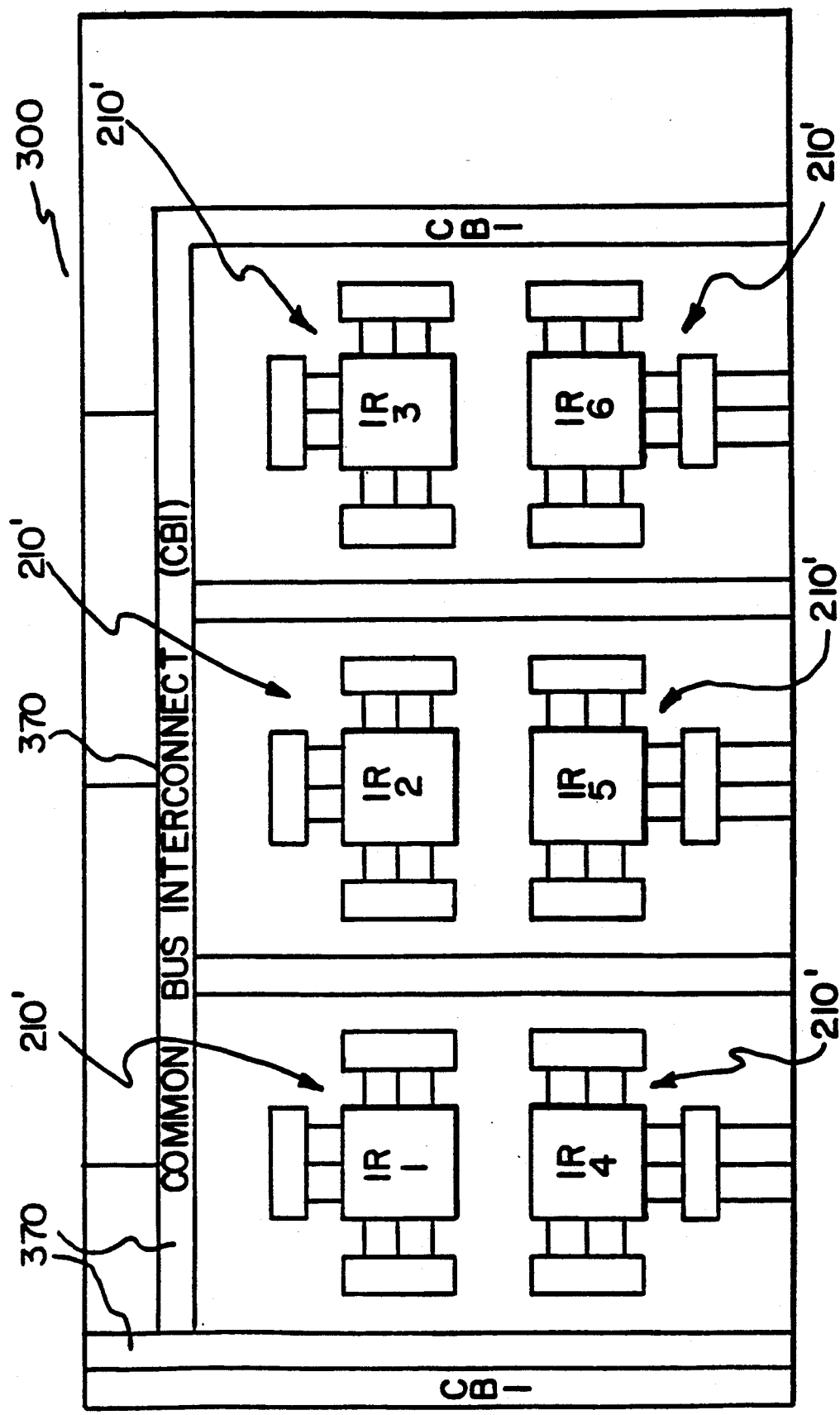
FIG. 9 illustrates a test assembly for testing multiple focal plane array sensor hybrids during a single cooling cycle of a cryogenic dewar.

In FIG. 9, a test assembly 300 is illustrated in plan view. The assembly 300 comprises six focal plane array sensor hybrids 210' arranged in a 2 × 3 matrix. The test assembly 300 comprises a substrate (not shown) which serves as a fabrication carrier for the individual focal plane array sensor hybrids 210'. This carrier has cavities therein disposed in proper relative positions to hold each of the chips and support members of the various hybrids. The chips and support members are appropriately placed and the dielectric layer 252' is laminated over the entire structure, including the fabrication carrier and all of the chips and support members. Appropriate via holes are then drilled in the dielectric layer in alignment with all contact pads to which connection is to be made. Thereafter, a layer of metal is deposited across the upper surface of the dielectric layer 252'. The metallization layer is then patterned to provide the conductors 254' and 256' which interconnect the various chips of the focal plane array sensor hybrid. In order to facilitate testing, each of the focal plane array sensor hybrids is connected to a bus structure 370 which connects to external test circuitry. This common bus structure 370 may either be permanently present on the test assembly carrier or may be fabricated as part of the high density interconnect structure by appropriate patterning of the metallization layer outside the area occupied by the individual focal plane array sensor hybrids.

While two or three readout chips are shown associated with each focal plane array chip, it will be understood that more or fewer readout chips may be used. Two or three readout chips are conventional for use with focal plane array chips, but to the extent that the number of chips is partially determined by contact pad spacing requirements, the number of chips may be reduced through use of the high density interconnect structure which provides the ability to place the connecting conductors 154 closer together than flying leads 14 can be placed.

The high density interconnect structure for six different hybrids is fabricated in a single fabrication process. This provides a 6 to 1 saving in the fabrication costs of the high density interconnect structure of the various hybrids. Once the test assembly 300 has been fully assembled, including forming the apertures 253' in the dielectric layer over each of the focal plane array chips, any desired room temperature testing may be performed. Thereafter, the entire test assembly 300 is mounted in a cryogenic test dewar and cooled to substantially 77° K. for further testing. The initial test performed at this temperature is the so-called "zero degree field of view" test in which external radiation is excluded from the system and the readout chips of a focal plane array sensor hybrid are exercised to read out every pixel of the focal plane array. The signals read out under this no-incident-radiation condition are then evaluated to determine whether there is an excessive number of leaky, noisy or otherwise unacceptable pixels in the focal plane array chip of each sensor hybrid. While it is hoped that all six of the focal plane array sensor hybrids will pass this test, some probably will not. So long as at least one hybrid passes this test, the test process continues with additional testing such as flood illumination in which uniform illumination is applied across the entire focal plane array chip and the focal plane array is read out and the signal response for the various pixels is compared to determine whether the focal plane array meets the specifications for cell-to-cell uniformity of response. When all of the necessary testing has been performed, the dewar is allowed to return to room temperature and the test assembly 300 is removed from the dewar. At that time, the individual focal plane array sensor hybrids which have passed a sufficient set of acceptance tests or conditions, are individually excised, separated or removed from the test assembly 300 by cutting the high density interconnect structure to separate the focal plane array sensor hybrid from the remainder of the test assembly high density interconnect structure, including those portions of the test bus system 370 which are not part of the focal plane array sensor hybrid. These acceptable, excised, hybrids are then ready for mounting in systems. These hybrids may be mounted by bonding them to a substrate, printed circuit board or other support, such as the expander of a cryogenic dewar with an adhesive or solder as may be desired.

After all of the acceptable hybrids have been removed from the test assembly, the assembly is heated to a temperature at which the thermoplastic adhesive is sufficiently fluid that the high density interconnect structure may be peeled off the test assembly and the remaining focal plane array and readout chips. Any residual remaining thermoplastic adhesive is removed by dissolving in a solvent for the polyester adhesive such as chloroform or by ultraviolet ablation, plasma etching or other techniques as may be appropriate as taught in the background patents and applications. Next, any faulty components or chips are removed from the remaining hybrid sets. These faulty components or chips are replaced with new components or chips. Sets of new components or chips are placed in the positions previously occupied by the acceptable hybrids which were excised form the test assembly prior to the beginning of the repair and replacement process.

It will be understood that a component may be considered to be a chip as such or may be viewed as a subsystem such as a readout system which may be embodied in a single chip or in a plurality of chips depending on its size and complexity and the size and complexity of the chips. Similarly, a single chip may in this sense contain a plurality of components in that one chip can contain a multiplexer, an amplifier and other subsystems, each of which may be considered a component of the system. A new high density interconnect structure is then formed on the test carrier to provide six new focal plane array sensor hybrids appropriately connected to test fixture contacts and the testing process is repeated.

One of the features of the flexible high density interconnect structure which makes this multi-hybrid test assembly feasible is the fact that the hybrid, once extracted from the test assembly, can then be mounted on an appropriate support structure. As a consequence, the individual focal plane array sensor hybrids may be placed closer together than would be possible if they had to be already mounted on their prior art printed circuit board support structures.

Depending on the particular system and application, the readout chips can have significant power dissipation associated with them in the sense that the power they dissipate is a significant portion of the heating load on the dewar cooling system. This is particularly true where significant amplification is provided by the readout chips, since the requisite low noise amplifiers may dissipate significant power even in their off state. Where that is the case, the thermal conductivity of the flexible interconnect structure may contribute to heating of the focal plane array sensor by conducting heat from the readout chips to the focal plane array chip. Such heat conduction can be reduced by providing a thermal break in the dielectric material of the flexible portion of the high density interconnect structure. This thermal break may be provided by removing a narrow strip of the dielectric layer to leave a gap 238 between two separate portions of the dielectric layer as illustrated in FIG. 10. The removal of this dielectric material may preferably be done by laser ablation and, if it is desired to remove any residual dielectric material from the individual conductors 254'', by plasma etching. Also shown in FIG. 10 are connector tabs 258 which extend from the end of the flexible high density interconnection structure for solder or other connection to conductors of external portions of the overall system in which the focal plane array sensor hybrid forms a part.

The conductors 254'' typically may range from 2 to 20 mils in width by from 2 to 10 microns in thickness. Consequently, these conductors are fragile. However, they are strong enough to be self-supporting across a gap in the dielectric layer 252''. There is little danger of unintentional short circuits between adjacent conductors 254'' where the gap in the dielectric material is maintained sufficiently short, since the conductors are held in fixed relation to each other at either side of the gap by their adhesion to the dielectric layer 252''.

Although not explicitly shown, the high density interconnect structure can have a rigid portion which connects a first readout chip to the focal plane array chip and a flexible portion which connects a second readout chip to the focal plane array chip.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of testing a focal plane array sensor hybrid comprising:
    disposing a focal plane array chip and an associated readout circuit chip on a support;
    forming a high density interconnect structure over said focal plane array chip, said readout circuit chip and said support, said interconnect structure connecting said focal plane array to its associated readout circuit to form a focal plane array sensor hybrid, the overall combination of said interconnect structure, said focal plane array and said readout circuit comprising a test assembly;
    exposing said focal plane array to a test condition;
    determining from the signals provided by focal plane array sensor hybrid whether that focal plane array hybrid satisfies an acceptance condition.

2. The method recited in claim 1 wherein:
    said test condition comprises an absence of radiation; and
    said acceptance condition is a noise level.

3. The method recited in claim 1 wherein:
    said test condition comprises exposure to radiation; and
    said acceptance condition is a cell-to-cell response uniformity.

4. The method recited in claim 1 wherein:
    said focal plane array sensor hybrid is intended for use at cryogenic temperatures and said method further comprises the step of:
    cooling said test assembly to less than 100° K. prior to taking the data with respect to said acceptance condition.

5. The method recited in claim 4 wherein:
    said test condition comprises an absence of radiation; and
    said acceptance condition is a noise level.

6. The method recited in claim 4 wherein:
    said test condition comprises exposure to radiation; and
    said acceptance condition is a cell response uniformity.

7. The method recited in claim 1 further comprising, for a focal plane array sensor hybrid which fails to satisfy a sufficient set of acceptance conditions, the steps of:
    determining whether the focal plane array chip, a readout circuit chip or the high density interconnect structure is a cause of failure;
    removing the high density interconnect structure from said hybrid;
    replacing any chip which has been determined to be a cause of said failure;
    forming a new high density interconnect structure interconnecting any replacement chip and any retained chip to form a repaired focal plane array sensor hybrid;
    exposing said repaired focal plane array sensor hybrid to said test condition;
    determining from the signals provided by said repaired focal plane array sensor hybrid whether that focal plane array sensor hybrid satisfies an acceptance condition.

8. A method of testing focal plane array sensor hybrids comprising:
    disposing a plurality of focal plane array chips and their associated readout circuit chips on a support;
    forming a common high density interconnect structure over said focal plane array chips, said readout circuit chips and said support, said interconnect structure interconnecting each of said focal plane array chips to its associated readout circuit to form a focal plane array sensor hybrid, the overall combination of said interconnect structure, said focal plane array chips and said readout circuits comprising a test assembly;
    exposing said focal plane array sensor hybrids to a test condition;
    determining from the signals provided by each of said focal plane array sensor hybrids whether that focal plane array sensor hybrid satisfies an acceptance condition.

9. The method recited in claim 8 wherein:
    said test condition comprises an absence of radiation; and
    said acceptance condition is a noise level.

10. The method recited in claim 8 wherein:
    said test condition comprises exposure to radiation; and
    said acceptance condition is a cell response uniformity.

11. The method recited in claim 8 wherein:
    said focal plane array sensor hybrids are intended for use at cryogenic temperatures and said method further comprises the step of:
    cooling said test assembly to less than 100° K. prior to taking the data with respect to said acceptance condition.

12. The method recited in claim 11 wherein:
    said test condition comprises an absence of radiation; and
    said acceptance condition is a noise, level

13. The method recited in claim 11 wherein:
said test condition comprises exposure to radiation; and
said acceptance condition is a cell response uniformity.

14. The method recited in claim 8 further comprising, for each focal plane array sensor hybrid which satisfies a sufficient set of acceptance conditions, the step of:
excising said focal plane array sensor hybrid from said test assembly.

15. The method recited in claim 8 further comprising, when some, but not all, of the focal plane array sensor hybrids of said test assembly satisfy a sufficient set of acceptance conditions, the steps of:
excising those of said focal plane array sensor hybrids which satisfy a sufficient set of acceptance conditions from the test assembly; and
for each of said focal plane array sensor hybrids which do not satisfy a sufficient set of said acceptance conditions, the steps of:
determining whether a focal plane array chip, a readout circuit chip or the high density interconnect structure is the cause of failure,
removing said high density interconnect structure from said focal plane array sensor hybrid, and
replacing any chip which has been determined to be a cause of said failure;
populating the empty test sites of said test assembly with additional focal plane array chips and readout circuit chips;
forming a new high density interconnect structure which interconnects any replacement chips and any retained chips to form repaired focal plane array sensor hybrids and which interconnects any additional focal plane array chips with their readout circuit chips to form additional focal plane array sensor hybrids;
exposing said repaired and additional focal plane array sensor hybrids to a test condition;
determining from signals provided by each of said repaired and additional focal plane array sensor hybrids whether that focal plane array sensor hybrid satisfies an acceptance condition.

16. The method recited in claim 8 further comprising, for each focal plane array sensor hybrid which fails to satisfy the acceptance condition, the steps of:
determining whether a focal plane array chip, a readout circuit chip or the high density interconnect structure is a cause of failure;
removing said high density interconnect structure from said failed focal plane array sensor hybrid;
replacing any chip which has been determined to be a cause of said failure;
forming a new high density interconnect structure interconnecting any replacement chips and any retained chips to form a repaired focal plane array sensor hybrid;
exposing said repaired focal plane array sensor hybrid to a test condition;
determining from signals provided by said repaired focal plane array sensor hybrid whether that focal plane array sensor hybrid satisfies an acceptance condition.

17. The method recited in claim 16 wherein said focal plane array sensor hybrid is intended for use at cryogenic temperatures and said method comprises the step of:
cooling new test configuration to a test temperature of less than 100° K. prior to taking data with respect to said acceptance condition.

18. A method of testing a plurality of cryogenic focal plane array radiation sensor chips, said method comprising:
disposing the plurality of focal plane array chips and associated readout circuit chips for said focal plane array chips on a substrate;
forming a common high density interconnect structure for said plurality of focal plane array chips, said interconnect structure interconnecting each of said focal plane array chips to its associated readout circuit chip or chips to form a focal plane array sensor hybrid, the overall combination of said interconnect structure, said focal plane array chips and said readout circuit chips comprising a test assembly;
cooling said test assembly to a test temperature of less than 100° K;
exposing said focal plane array sensor hybrids to a test condition;
determining from the signals provided by the readout circuit of each focal plane array sensor hybrid whether that focal plane array sensor hybrid satisfies an acceptance condition.

19. The method recited in claim 18 further comprising, for each focal plane array sensor hybrid which fails to satisfy the acceptance condition, the steps of:
determining whether a focal plane array chip, a readout circuit chip or the high density interconnect structure is a cause of failure;
removing the high density interconnect structure form said sensor hybrid;
replacing any chip which has been determined to be a cause of said failure;
forming a new high density interconnect structure which interconnects any replacement chip with the other chips of said focal plane array sensor hybrid to form a repaired focal plane array sensor hybrid comprising a new test assembly;
cooling said new test assembly to a test temperature of less than 100° K;
exposing said repaired focal plane array sensor hybrid to a test condition;
determining from the signals provided by said repaired focal plane array sensor hybrid whether that focal plane array sensor hybrid satisfies an acceptance condition.

20. The method recited in claim 18, further comprising, for each focal plane array sensor hybrid which satisfies a sufficient set of acceptance conditions, the step of:
separating said hybrid from the other focal plane array sensor hybrids.

* * * * *